United States Patent
Cases et al.

[19]

[11] Patent Number: 5,828,259
[45] Date of Patent: Oct. 27, 1998

[54] METHOD AND APPARATUS FOR REDUCING DISTURBANCES ON AN INTEGRATED CIRCUIT

[75] Inventors: Moises Cases; Leon Li-heng Wu, both of Austin, Tex.

[73] Assignee: International Business Machines Corporation, Armonk, N.Y.

[21] Appl. No.: 746,950

[22] Filed: Nov. 18, 1996

[51] Int. Cl.⁶ .................................................. H01H 83/20
[52] U.S. Cl. ......................... 327/376; 327/377; 327/389; 327/390; 307/129
[58] Field of Search ................................... 327/198, 142, 327/143, 375–377, 380, 381, 390, 391, 387, 388; 326/82, 87; 307/98, 99, 129

[56] References Cited

U.S. PATENT DOCUMENTS

| | | | |
|---|---|---|---|
| 3,621,347 | 11/1971 | Van Nielen | 327/434 |
| 3,657,602 | 4/1972 | Boehm et al. | 361/15 |
| 3,772,097 | 11/1973 | Davis | 437/60 |
| 4,427,457 | 1/1984 | Carlson et al. | 437/20 |
| 4,825,106 | 4/1989 | Tipon et al. | 326/121 |
| 4,972,101 | 11/1990 | Partovi et al. | 326/86 |
| 5,067,005 | 11/1991 | Michii et al. | 257/700 |
| 5,101,314 | 3/1992 | Yamaguchi | 361/15 |
| 5,148,391 | 9/1992 | Zagar | 365/95 |
| 5,172,012 | 12/1992 | Ueda | 327/143 |
| 5,212,402 | 5/1993 | Higgins, III. | 257/532 |
| 5,212,415 | 5/1993 | Murakami et al. | 327/390 |
| 5,506,457 | 4/1996 | Krauter et al. | 307/129 |
| 5,543,750 | 8/1996 | Oh | 327/390 |

FOREIGN PATENT DOCUMENTS 3-153119  7/1991  Japan ..................................... 327/143

*Primary Examiner*—Timothy P. Callahan
*Assistant Examiner*—T. T. Lam
*Attorney, Agent, or Firm*—Anthony V. S. England

[57] ABSTRACT

A decoupling capacitor for an integrated circuit is operatively coupled to a supply and to control circuitry for isolating the capacitor. The control circuitry automatically isolates the capacitor in response to a current through the capacitor exceeding a certain threshold, but tends to restore the capacitor to operation if the current is merely caused by momentary conditions, rather than substantial failure of the capacitor. The control circuitry includes a first control device for automatically switching to an off state to isolate the capacitor in response to a voltage produced by the current exceeding a certain threshold. A discharging device tends to discharge the voltage and automatically turn on the first device when the current is caused by momentary conditions. The discharging device may include a control device responsive to an external control signal for switching the first control device on and off.

12 Claims, 1 Drawing Sheet

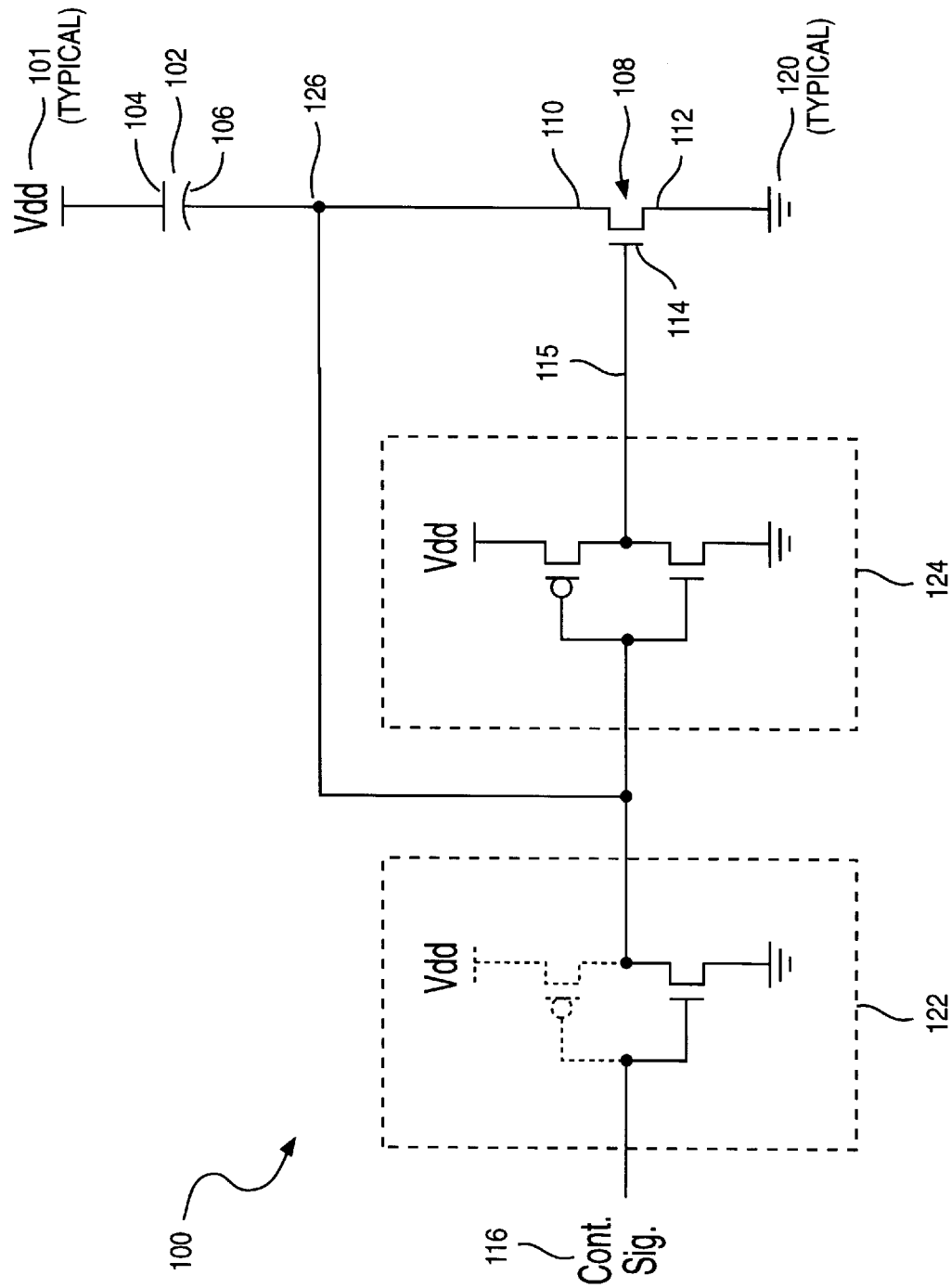

METHOD AND APPARATUS FOR REDUCING DISTURBANCES ON AN INTEGRATED CIRCUIT

FIELD

This invention relates generally to noise on integrated circuitry and more specifically may apply to reducing noise induced into integrated circuitry power supplies.

CROSS REFERENCE TO RELATED PATENT APPLICATIONS

This patent application is related to U.S. patent application Ser. No. 08/518,083, entitled CONTROLLABLE DECOUPLING CAPACITOR, by Walls et al; filed Aug. 22, 1995.

BACKGROUND

Capacitors may be used to reduce variation in voltage supplied to integrated circuitry, by coupling one or more capacitors from the supply to ground. Such capacitors tend to decouple the voltage supply from disturbances induced by activity of the supplied circuitry, and thus also to decouple portions of the circuitry itself.

It is common to include these decoupling capacitors on the die with the circuitry and to include means for limiting excessive capacitor leakage current that might develop, such as due to oxide failure. For example, a fuse may be included in series with such a capacitor, so that the fuse blows when the leakage current exceeds an allowable limit, thereby isolating the capacitor from ground so that the leakage current is substantially stopped. However, this is not ideal, because of heating required to blow the fuse.

Control circuitry has also been used to limit excessive leakage current. Krauter et al., U.S. Pat. No. 5,506,457, discloses control circuitry including a transistor in series with the capacitor, and feedback circuitry which turns off the series transistor if the capacitor develops excess leakage current. The feedback circuitry is responsive to voltage on a feedback node coupling one of the capacitor electrodes and one of the series transistor conducting electrodes.

One problem with such prior art control circuitry concerns sensitivity to transient currents. That is, the control circuitry may tend to respond to mere transient currents through the capacitor that arise from activity on circuitry supplied by the power supply. Even if the prior art feedback circuitry switches off the series transistor in response to a transient current, the series transistor tends to be held in the off state after the transient has subsided. Of course, this is a desirable response to excessive leakage current caused by oxide failure, but ideally there should be a different response for a transient current.

SUMMARY

An objective of the invention is to protect against excessive current through a decoupling capacitor.

Another objective is to distinguish between transient and more static conditions, in protecting against excessive current.

According to the present invention, the foregoing and other objects are attained by circuitry which includes a capacitor operatively coupled to a supply, and control circuitry for isolating the capacitor. The control circuitry isolates the capacitor in response to a current exceeding a certain threshold, but tends to restore the capacitor to operation if the current subsides.

In a further aspect, the control circuitry includes first second and third control devices. Such a control device may be a transistor, which has first and second conducting electrodes and a control (i.e., gate) electrode. The first control device may be switched to an off state to isolate the capacitor, by the second control device in response to a voltage produced by the excessive current. The third control device tends to discharge the voltage so that the second control device tends to turn on the first device if the current subsides.

In a still further aspect, the first control device is in series with the capacitor. One of the capacitor electrodes and one of the conducting electrodes of the first control device are operatively coupled at a node. Also coupled at the node, is the control electrode of the second control device. One of the conducting electrodes of the second control device is coupled to the control electrode of the first control device, so that the first control device is turned off, isolating the capacitor, by the second control device in response to the voltage on the node exceeding a voltage threshold (corresponding to the aforementioned current threshold). The third control device has a conducting electrode coupled to the node, and a conducting electrode coupled to ground, so that if the third control device is turned on, the node tends to discharge.

It is an advantage of the present invention that voltage supply variations and circuitry disturbances are reduced without undesirable consequences that may accompany the use of a fuse with the decoupling capacitor.

It is another advantage of the present invention that when the control circuitry isolates the capacitor in response to the condition of excessive current (and accompanying voltage), if the condition is transient the control circuitry responds further to de-isolate the capacitor, i.e., put the capacitor back into operation.

Additional objects, advantages, and novel features are set forth in the following description, or will be apparent to those skilled in the art or those practicing the invention. Other embodiments are within the spirit and scope of the invention. These objects and embodiments may be achieved by the combinations pointed out in the appended claims. The invention is intended to be limited only as defined in the claims.

BRIEF DESCRIPTION OF THE DRAWINGS

FIG. 1 illustrates, for the present invention, circuitry for controlling a decoupling capacitor.

DETAILED DESCRIPTION

To clearly point out novel features of the present invention, the following discussion omits or only briefly describes conventional features of decoupling capacitors which are apparent to those skilled in the art. For example, it is assumed that those skilled in the art are familiar with forming capacitors, transistors, interconnections and other aspects of integrated circuitry in semiconducting media, and with the electrical properties of such circuitry.

Referring now to FIG. 1, device 100, for reducing disturbances on an integrated circuit, is shown. Power supply 101, labelled "Vdd" in accordance with common terminology, is shown operatively coupled to capacitor 102. The capacitor 102 has two electrodes 104 and 106, electrode 104 being coupled to Vdd as an anode, and electrode 106 being coupled through control device 108 to ground 120 as a cathode. Control device 108 is an N type, field effect transistor ("NFET"), having first and second conducting electrodes 110 and 112, connected as source 112 and drain 110. Device 108 also has a control electrode, or gate, 114. Source 112 is connected to ground 120. Drain 110 is connected to the capacitor 102 cathode 106, forming node 126.

Also connected to node 126 is the "gate" of a second control device, inverter 124, and a conducting electrode of a third control device 122. The inverter 124 has an NFET and PFET connected with conducting electrodes in series and gates in parallel. These parallel connected gates are referred to herein as the control electrode, or gate, of the second control device. The connected drains of the NFET and PFET are referred to as one of the conducting electrodes of the inverter, or second control device 124.

In the preferred embodiment, a PFET is included in the third control device 122, as shown by dashed lines in FIG. 1. The PFET and NFET 122 are connected as a second inverter.

One of the conducting electrodes of inverter 124 is connected to the gate 114 of NFET 108, forming node 115. The other conducting electrodes of inverter 124 and NFET 122 are connected to ground 120. The control electrode of NFET 122 is connected to an external signal 116.

The operation of circuitry 100 is as follows. In normal operation, NFET 122 is turned on (and, if present, PFET 122 is turned off) by the external signal 116 so that NFET 122 tends to discharge node 126. (It would be possible to substitute a resistor or other suitable device in place of the third control device, NFET 122, in order to discharge node 126.) In terms of current carrying capacity, NFET 122 is the smallest possible NFET, whereas NFET 108 is a substantially larger NFET, so that within short time intervals, such as a few RC time constants, when NFET's 108 and 122 are on, the voltage generated at node 126 by current flow through capacitor 102 is not greatly affected by the presence of NFET 122. For example, NFET 108 may have a channel width of one hundred to two hundred microns, and NFET 122 may have a channel width of one to two microns, so that, when conducting, the resistance of NFET 122 is about 100 times that of NFET 108.

With NFET 122 on, this tends to turn on PFET 124 and turn off NFET 124, pulling node 115 and gate 114 high. This tends to turn on NFET 108 so that capacitor 102 is operative (i.e., not isolated from ground). However, if capacitor 102 allows sufficient current to flow, either due to transient conditions or a longer term condition, the current through NFETs 108 and 122 generate enough voltage at node 126 to exceed the switching thresholds of NFET 124 and PFET 124, so that inverter 124 automatically tends to pull node 115 and gate 114 down and switch off NFET 108. This substantially isolates capacitor 102, that is, isolates the capacitor 102 except for the relatively high resistance path to ground through NFET 122.

If the condition giving rise to the excessive current is a long term condition, and the current is large, as is ordinarily the case in the event of oxide failure, the small path to ground through NFET 122 will not be sufficient to discharge node 126 to below the switching threshold for FET's 124, and the capacitor 102 will remain substantially isolated from ground. On the other hand, if the current is transient, such as due to a transient switching condition, NFET 122 will be able to eventually discharge node 126, that is, perhaps after one or more RC time constants. When the voltage at node 126 falls to below the switching threshold for FET's 124 this will tend to turn on FET 108 again, and de-isolate capacitor 102, that is, return the capacitor to full operation.

With the inclusion of PFET 122, the external control signal can be used to turn off FET 108, such as may be desirable for testing of the integrated circuitry (not shown) served by the decoupling capacitor. That is, if the external control signal is low, this turns on PFET 122 and turns off NFET 122. PFET 122 is sufficiently large to force NFET 124 on PFET 124 off, despite opposition by NFET 114. With PFET 124 on and NFET 124 off this turns off NFET 108.

Although the present invention and its advantages have been described in detail, it should be understood that various changes, substitutions and alterations can be made without departing from the spirit and scope of the invention as defined by the following claims.

What is claimed is:

1. An apparatus for reducing disturbances on an integrated circuit, comprising:

a capacitor operatively coupled to a supply voltage for the integrated circuit; and control circuitry operatively coupled to the capacitor, wherein a first control device is automatically switched off, to substantially isolate the capacitor, by a second control device in response to a voltage produced by current through the capacitor exceeding a certain threshold, and a third device tends to discharge that voltage to automatically switch the first control device on again in response to the current through the capacitor subsiding, so that the control circuitry tends to isolate the capacitor in response to a current through the capacitor exceeding a certain threshold, and tends to restore the capacitor to operation in response to the current through the capacitor subsiding.

2. The apparatus of claim 1, wherein the first and second control devices each include a control electrode and first and second conducting electrodes, and wherein the capacitor, the first conducting electrode of the first control device, and the control electrode of the second control device are operatively coupled at a node, and the first conducting electrode of the second control device is coupled to the control electrode of the first control device, so the first control device is turned off, isolating the capacitor, by the second control device responsive to the voltage on the node.

3. The apparatus of claim 1, wherein the second control device include an inverter.

4. The apparatus of claim 1, wherein the third device includes a resistor.

5. The apparatus of claim 1, wherein a conducting resistance of the third device determines, at least in part, the voltage produced by the current through the capacitor, and the conducting resistance is large enough that, in response to the first control device being off and said current through the capacitor being at least as large as a current caused by substantial failure of the capacitor, said current through the capacitor maintains said voltage above the certain threshold and keeps the first control device switched off.

6. The apparatus of claim 5, wherein the conducting resistance of the third device is small enough to discharge said voltage to below the certain threshold and switch on the first control device, in response to the current through the capacitor being smaller than a current caused by substantial failure of the capacitor.

7. The apparatus of claim 1, wherein the third device includes a third control device responsive to an external control signal for switching the first control device on and off.

8. In an apparatus having a decoupling capacitor coupled to a supply voltage for an integrated circuit and coupled to control circuitry, a method for reducing disturbances on the integrated circuit comprising the steps of:

substantially isolating the capacitor by the control circuitry responding to a current through the capacitor exceeding a certain threshold, wherein the isolating includes switching off a first control device to substantially isolate the capacitor, by a second control device responding to a voltage produced by the current through the capacitor exceeding the certain threshold; and restoring the capacitor to operation by the control circuitry in response to the current through the capacitor subsiding, wherein the restoring includes discharging the voltage by a third device so the first control device is switched on again in response to the current through the capacitor subsiding.

9. The method of claim 8, comprising the step of:

maintaining said voltage above the certain threshold, to keep the first control device switched off, in response to the first control device being off and said current through the capacitor being at least as large as a current caused by substantial failure of the capacitor.

10. The method of claim 9, wherein in the step of restoring the capacitor to operation by the control circuitry, the first control device is switched on again in response to the current through the capacitor subsiding to less than an amount of current caused by substantial failure of the capacitor.

11. An apparatus for reducing disturbances on an integrated circuit, comprising:

a capacitor operatively coupled to a supply voltage for the integrated circuit and coupled at a node to a first control device;

a discharging device, coupled to the node for discharging current from the node; and second control device, operatively coupled to the node and the first control device, for switching off the first control device to substantially isolate the capacitor, in response to a voltage at the node exceeding a certain threshold, the voltage being produced by a current supplied through the capacitor to the first control device and the discharging device;

wherein the discharging device has a large enough conducting resistance such that, after said first control device has switched off in response to said voltage exceeding the certain threshold, then, while the current through the capacitor is at least as large as a current caused by substantial failure of the capacitor, the current through the capacitor maintains the voltage at the node above the certain threshold, so that the first control device remains switched off.

12. The apparatus of claim 11, wherein the conducting resistance of the discharge device is small enough to discharge the node voltage in response to the current through the capacitor being smaller than a current caused by a substantial failure of the capacitor, so that the first control device is switched on again to restore the capacitor to operation.

\* \* \* \* \*